(12) United States Patent
Ohba

(10) Patent No.: US 6,323,666 B1
(45) Date of Patent: Nov. 27, 2001

(54) APPARATUS AND METHOD FOR TESTING TEST BURN-IN BOARD AND DEVICE UNDER TEST, AND TEST BURN-IN BOARD HANDLER

(75) Inventor: Masafumi Ohba, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/382,784

(22) Filed: Aug. 25, 1999

(30) Foreign Application Priority Data

Jan. 28, 1999 (JP) .................................................. 11-020421

(51) Int. Cl.⁷ .................................................. G01R 31/28
(52) U.S. Cl. ............................................. 324/760; 324/765
(58) Field of Search ..................................... 324/765, 760; 165/80.1, 80.3, 80.5; 219/209; 361/760, 761

(56) References Cited

U.S. PATENT DOCUMENTS 5,414,370 * 5/1995 Hashinaga et al. ................... 324/760
5,949,241 * 9/1999 Akram et al. ......................... 324/755
5,966,021 * 10/1999 Eliashberg et al. .................. 324/760

FOREIGN PATENT DOCUMENTS 8-78497  3/1996  (JP) .

* cited by examiner

*Primary Examiner*—Vinh P. Nguyen
(74) *Attorney, Agent, or Firm*—Oliff & Berridge, PLC

(57) ABSTRACT

A test burn-in board handler for inserting and pulling out ICs under test in and from a test burn-in board, the handler comprising: a test circuit; and a burn-in board checker. The test circuit performs a pretest of the ICs under test by a simplified function test before the ICs under test are burn-in tested. The burn-in board checker tests the test burn-in board. The handler further comprises an electronic switch. The electronic switch is electrically connected with the test burn-in board on which the ICs under test are mounted, and the electronic switch switches between the first test signals of the test circuit and the second test signals of the burn-in board checker. An alignment stage straightens attitudes of the ICs under test transferred from a tray on which the ICs under test are mounted. After the attitudes of the ICs under test are straightened at the alignment stage, the ICs under test are transferred to and mounted on normal IC sockets on the test burn-in board. The test circuit performs the pretest of the ICs under test in a state that the ICs under test are mounted on the normal IC sockets judged non-defective by the burn-in board checker.

7 Claims, 2 Drawing Sheets

APPARATUS AND METHOD FOR TESTING TEST BURN-IN BOARD AND DEVICE UNDER TEST, AND TEST BURN-IN BOARD HANDLER

BACKGROUND OF THE INVENTION

1. Field of the Invention

The present invention relates to an apparatus for testing both of a test burn-in board (hereinafter, it may be simply referred to "TBIB") and a device under test, in particular, it relates to a test burn-in board handler for inserting and pulling out a device under test in and from a TBIB in a test burn-in process for the device under test, such as an integrated circuit (IC).

2. Description of Related Art

For an apparatus for carrying out a screening test, such as a burn-in process in order to remove a semiconductor device having an inherent defect or a device leading a failure depending on time and stress because of variation of production, a burn-in apparatus has been known.

Before the burn-in, a pretest of the device under test is carried out in the test burn-in board handler, as described later.

The test burn-in board handler (hereinafter, it may be simply referred to "TBIB handler") is used for the devices, such as, for instance, memory integrated circuits of a TSOP type or a SOJ type, which are surface mounting types.

Next, the organization of the TBIB handler in earlier technology will be explained as follows with referring to FIG. 2.

In FIG. 2, reference numeral 1A denotes an IC under test (hereinafter, it may be simply referred to "IC"), reference numeral 5 denotes a tray, reference numeral 8 denotes a carrier rack, reference numeral 20 denotes a TBIB handler, reference numeral 21 denotes a TBIB, reference numeral 22 denotes an IC test circuit, reference numeral 26 denotes an alignment stage, and reference numeral 27 denotes a test stage.

In FIG. 2, recess portions are formed crosswise in the tray 5, which are partly shown in the Figure, wherein the ICs 1A are loaded. The trays 5, for example, 35 pieces thereof are piled up. The respective ICs 1A are transferred one after another from the trays 5 to the alignment stages 26 by a hand with a vacuum absorbing system, which is not shown.

The ICs 1A are loaded in recess portions formed in the alignment stages 26 and having shapes which are slightly larger than the external shapes of the ICs 1A, where attitudes of the ICs 1A are straightened. The ICs 1A of which attitudes are straightened are transferred from the alignment stages 26 to the test stages 27 by the hand with the vacuum absorbing system.

On the test stages 27, IC sockets as electrodes are disposed and electrically connected to the IC test circuit 22. The ICs 1A which are in contacted with the IC sockets are tested by the IC test circuit 22.

The IC test circuit 22 performs the pretest of the ICs 1A by a simplified function test before the burn-in test of the ICs 1A. The ICs 1A judged non-defective by the IC test circuit 22 are transferred to the TBIB 21 described later and inserted in IC sockets on the TBIB 21.

In the carrier rack 8, the TBIBs 21 in which the ICs 1A are not inserted are piled. A piece of TBIB 21 is took out from the carrier rack 8 and transferred to the inserting position for the ICs 1A.

At the inserting position, as above-described, the ICs 1A with non-defective are transferred from the test stages 27 to the TBIB 21 and inserted in the IC sockets thereon. When the predetermined number of ICs 1A are inserted in the TBIB 21, the TBIB 21 is returned to the carrier rack 8.

After the ICs 1A are inserted in all TBIBs 21 in the carrier rack 8, the carrier rack 8 is transferred to the burn-in apparatus performing the burn-in test which is the next process. Then, a series of operations of the TBIB handler 20 are completed.

With the TBIB handler 20 having the structure as shown in FIG. 2, the ICs 1A determined non-defective by the IC test circuit 22 are mounted on the TBIBs 21, however, after the ICs 1A are mounted on the TBIBs 21, the pretest of the ICs 1A is not carried out by the IC test circuit 22.

Accordingly, in the burn-in test in the next process, when it is judged defective because of a contact failure between the IC socket on the TBIB 21 and the IC 1A, the IC 1A is removed from the IC socket at the position by a manual work.

SUMMARY OF THE INVENTION

The present invention was developed in view of the above-described problem. Therefore, an object of the present invention is to provide a TBIB handler having a burn-in board checker for testing a TBIB, and a test circuit for performing a pretest of ICs by a simplified function test. Another object of the invention is to provide an apparatus for testing a burn-in board, which tests both of the burn-in board and the device under test.

In order to accomplish the above-described object, in one aspect of the present invention, a TBIB handler for inserting and pulling out ICs in and from a TBIB, the handler comprises: a test circuit for performing a pretest of the ICs by a simplified function test before the ICs are burn-in tested; and a burn-in board checker for testing the TBIB.

The burn-in board checker is for testing the TBIB to check defects thereof, for example, a pattern disconnection, a solder failure, a short circuit or other defect. According to the TBIB handler, the TBIB handler comprises the test circuit for the ICs and the burn-in board checker, so that the TBIB is tested by the burn-in board checker and the pretest of the ICs by the simplified function test is performed by the test circuit before the burn-in test.

The TBIB handler can further comprise an electronic switch being electrically connected with the TBIB on which the ICs are mounted, and the electronic switch switching between first test signals of the test circuit and second test signals of the burn-in board checker.

According to the TBIB handler comprising the electronic switch, when the electronic switch switches to a side of the test circuit with the first test signals and the TBIB on which the ICs are mounted is electrically connected with the test circuit for IC, the pretest of the ICs can be performed, while when the electronic switch switches to a side of the burn-in board checker with the second test signals, the TBIB can be tested.

The TBIB handler can further comprise an alignment stage for straightening attitudes of the ICs transferred from a tray on which the ICs are mounted, wherein after the attitudes of the ICs are straightened at the alignment stage, the ICs can be transferred to and mounted on normal integrated circuit sockets on the TBIB.

According to the TBIB handler, the attitudes of the ICs can be straightened at the alignment stage, thereafter the ICs can be transferred to and mounted on the normal integrated circuit sockets on the TBIB, so that the ICs of which attitudes are straightened at the alignment stage can be directly transferred to the normal integrated circuit sockets on the TBIB and mounted thereon.

With the TBIB handler, the pretest of the ICs can be performed by the test circuit in a state that the ICs are mounted on the normal integrated circuit sockets on the TBIB, the normal sockets are judged non-defective by the burn-in board checker.

Accordingly, it can be possible to perform the pretest of the ICs in the state that the ICs are mounted on the normal integrated circuit sockets on the TBIB. Therefore, the electronic switch switches between the test of the TBIB and the pretest of the ICs in a state that the ICs are mounted on the TBIB, thereby the TBIB handler can have improved test efficiency.

With the TBIB handler, the test circuit, the burn-in board checker and the electrical switch can be made up as a unit, and the unit can be connected to the test burn-in board through a connector.

According to the TBIB handler, the test circuit, the burn-in board checker and the electrical switch can be made up as the unit, and the unit can be connected to the TBIB through the connector, thereby the test circuit, the burn-in board checker and the electrical switch can be easily and electrically connected with the TBIB as one unit through the connector, so that it can be possible to enable various combinations of testers.

In accordance with another aspect of the present invention, an apparatus for testing a burn-in board and for inserting and pulling out a device under test in and from a burn-in board, the apparatus comprises: a test circuit for testing the device under test before a burn-in test; and a burn-in board checker for testing the burn-in board.

BRIEF DESCRIPTION OF THE DRAWINGS

The above and other objects, features and advantages of the invention will become more apparent from the following description taken in conjunction with the accompanying drawings wherein like references refer to like parts and wherein.

PREFERRED EMBODIMENT OF THE INVENTION

Figure 1:
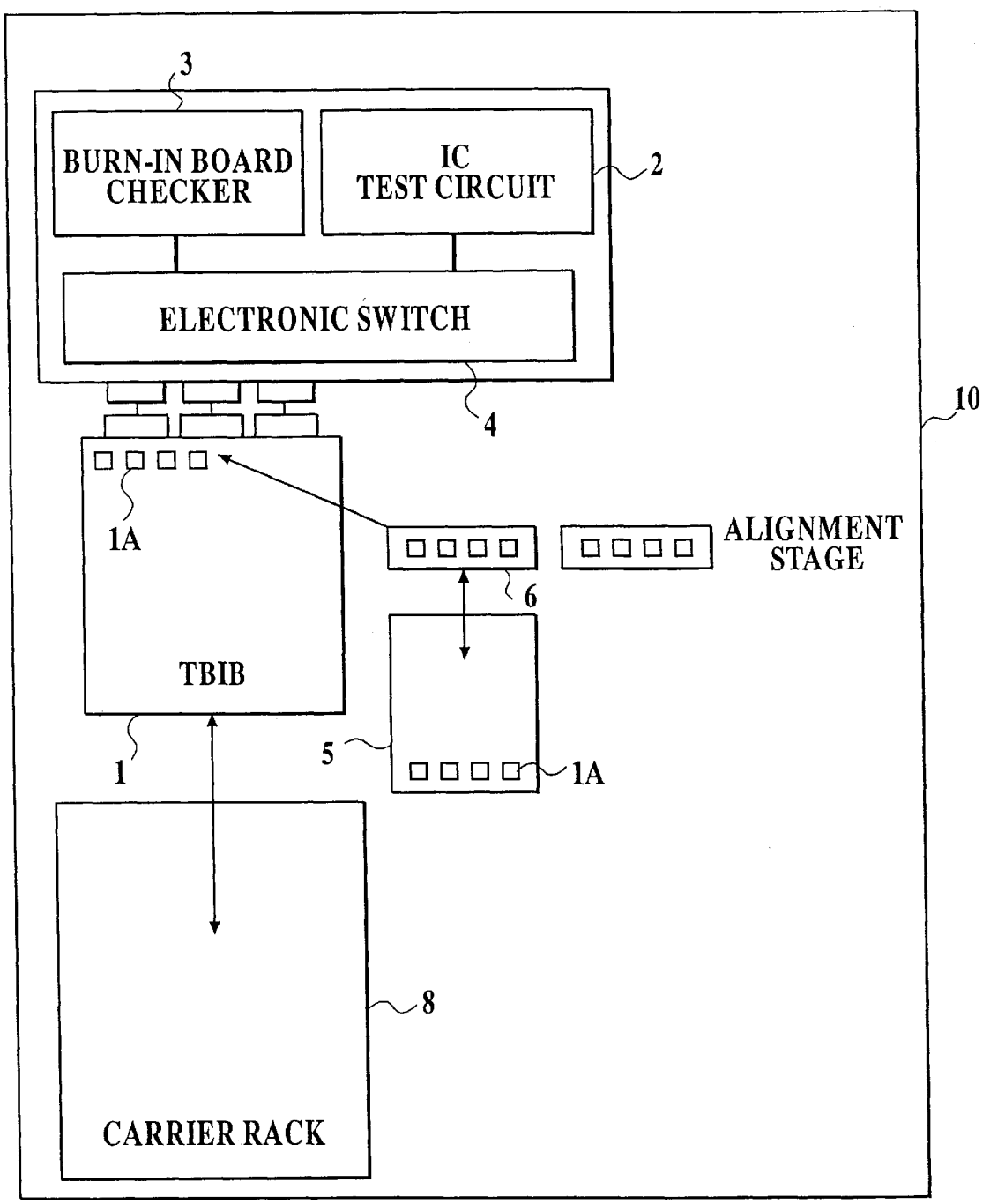
FIG. 1 is a diagrammatic illustration showing the organization of a TBIB handler according to an embodiment of the present invention.

The TBIB handler according to the embodiment of the invention will be explained as follows with referring to the drawings.

FIG. 1 is a diagrammatic illustration showing the organization of a TBIB handler according to an embodiment of the present invention. In FIG. 1, reference numeral 1 denotes a TBIB as a burn-in board, reference numeral 2 denotes an IC test circuit, reference numeral 3 denotes a burn-in board checker, reference numeral 4 denotes an electronic switch, reference numeral 6 denotes an alignment stage, and reference numeral 10 denotes a TBIB handler.

Figure 2:
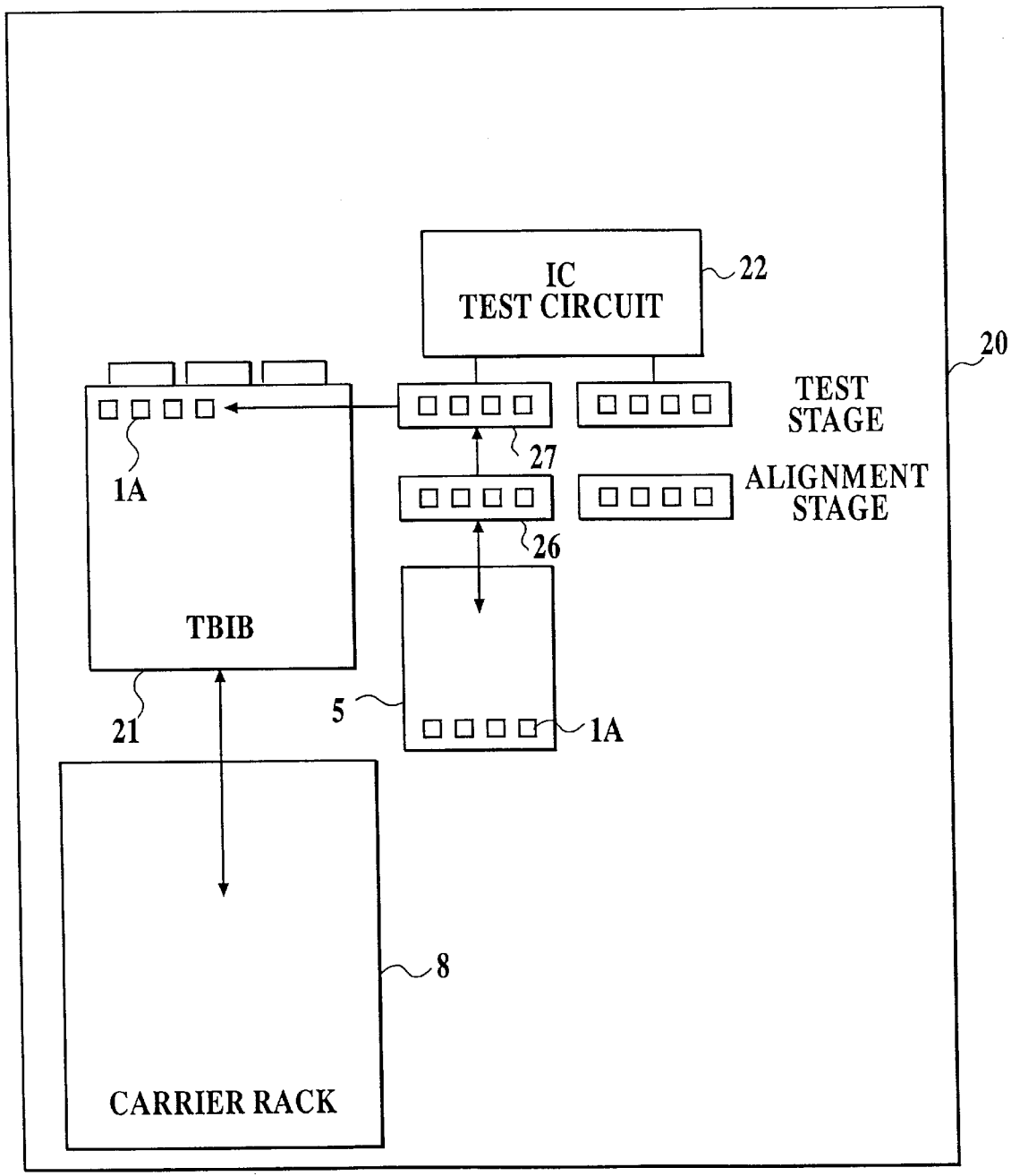
FIG. 2 is a diagrammatic illustration showing the organization of a TBIB handler in earlier technology.

In FIG. 1, to structural members, elements or the like corresponding to those shown in FIG. 2, the same reference numerals are attached, and the detailed explanation for them is properly omitted.

As shown in FIG. 1, the electrical switch 4 is electrically connected to the TBIB 1. The electrical switch 4 switches between test signals of the IC test circuit 2 (the first test signals) and test signals of the burn-in board checker 3 (the second test signals).

As shown in the Figure, the IC test circuit 2, the burn-in board checker 3 and the electrical switch 4 are made up as a unit, and the unit can be connected to the TBIB 1 through connectors.

The IC test circuit 2 as a test circuit is for performing the pretest of the ICs 1A as devices under test. The burn-in board checker 3 is for testing the TBIBs 1 to check if the TBIBs 1 have the pattern disconnection, the solder failure, the short circuit or other defects or not. The alignment stage 6 is for straightening the attitude of the ICs 1A, as in the earlier technology.

Next, the operations of the TBIB handler 10 will be explained as follows.

In the carrier rack 8 shown in FIG. 1, the TBIBs 1 in which the IC 1A is not inserted are piled. A piece of TBIB 1 is took out from the carrier rack 8 and transferred to the inserting position for the ICs 1A.

At the inserting position, the TBIB 1 is tested by the burn-in board checker 3. The IC sockets judged non-defective by the burn-in board checker 3 are called normal IC sockets. The TBIB 1 judged by the burn-in board checker 3 waits for receiving the ICs 1A at the inserting position.

The ICs 1A are transferred one after another from the tray 5 to the alignment stages 6 by the hand which is not shown, with the vacuum absorbing system. After the attitudes of the ICs 1A are straightened at the alignment stages 6, the ICs 1A of which attitudes are straightened are transferred from the alignment stages 6 to the TBIB 1 and inserted in the normal IC sockets by the hand with the vacuum absorbing system. On the other hand, defective IC sockets on the TBIB 1 are masked by software, so that the ICs 1A are not inserted therein.

At this time, the electronic switch 4 is switched to a side of the IC test circuit 2. Then, the pretest of the ICs 1A is performed by the simplified function test in the state that the ICs 1A are inserted in the normal IC sockets on the TBIB 1.

After the pretest, the ICs 1A judged non-defective remain in the normal IC sockets on the TBIB 1, while the ICs 1A judged defective are pulled out from the TBIB 1 and transferred to trays for defective products use, which are not shown.

After the ICs 1A judged non-defective are inserted in all normal IC sockets on the TBIB 1, the TBIB 1 is returned to the carrier rack 8.

When the ICs 1A are mounted on all TBIBs 1 in the carrier rack 8, the carrier rack 8 as a unit is transferred to the burn-in apparatus performing the burn-in test which is the next process. Then, a series of operations of the TBIB handler 10 are completed.

As above-described, according to the TBIB handler 10 of the invention, the ICs 1A of which attitudes are straightened at the alignment stage 6 are transferred directly to and mounted on the normal IC sockets on the TBIB 1, thereafter the pretest of the ICs 1A is performed, so that it is possible to improve capability of the TBIB handler 10 to process the ICs.

Further, with the TBIB handler 10, because the pretest of the ICs 1A can be performed in the state that the ICs 1A are mounted on the normal IC sockets on the TBIB 1, the operations for confirming the contact failure of the ICs are not required in the burn-in test which is the next process.

Further, the TBIBs 1 are tested before the pretest, so that it is possible to prevent that the normal ICs are inserted in the defective IC sockets.

The TBIB 1 on which the ICs 1A are mounted can be electrically connected with both of the test circuit 2 and the burn-in board checker 3 by switching the electronic switch 4.

The test circuit 2, the burn-in board checker 3 and the electrical switch 4 can be easily and electrically connected with the TBIB 1 as one unit through the connector, it has the advantage enabling various combinations of testers.

In the described embodiment, the IC test circuit 2, the burn-in board checker 3 and the electrical switch 4 are made up as a unit, and the unit is connected to the test burn-in board 1 through the connectors. However, it is not limited to this, the electrical switch 4 may be connected to the test burn-in board 1 and the IC test circuit 2 and the burn-in board checker 3 may be connected to the electrical switch 4 through connectors, respectively.

From the foregoing description, one skilled in the art can easily ascertain the essential characteristics of this invention, and without departing from the spirit and scope thereof, can make various changes and modifications of the invention to adapt it to various usage and conditions.

The entire disclosure of Japanese Patent Application No. 11-20421 filed on Jan. 28, 1999 including specification, claims, drawings and summary are incorporated herein by reference in its entirety.

What is claimed is:

1. A test burn-in board handler being configured to insert integrated circuits under test into a test burn-in board and to pull the integrated circuits under test out of the test burn-in board, the handler comprising:

a test circuit for performing a pretest of the integrated circuits under test by a simplified function test before the integrated circuits under test are burn-in tested;

a test member for testing the test burn-in board; and an electronic switch being electrically connected with the test burn-in board on which the integrated circuits under test are mounted, and the electronic switch switching between first test signals of the test circuit and second test signals of the test member.

2. The test burn-in board handler as claimed in claim 1, further comprising an alignment stage for straightening attitudes of the integrated circuits under test transferred from a tray on which the integrated circuits under test are mounted, wherein after the attitudes of the integrated circuits under test are straightened at the alignment stage, the integrated circuits under test are transferred to and mounted on normal integrated circuit sockets on the test burn-in board.

3. The test burn-in board handler as claimed in claim 1, wherein when the pretest of the integrated circuits under test are performed by the test circuit, the integrated circuits under test are mounted on only normal integrated circuit sockets on the test burn-in board, the normal sockets having been judged non-defective by the test member, and no integrated circuits under test are mounted on integrated circuit sockets which were judged defective by the test member.

4. The test burn-in board handler as claimed in claim 1, wherein the test circuit, the test member and the electrical switch are made up as a unit, and the unit is connected to the test burn-in board through a connector.

5. An apparatus for testing a test burn-in board and a device under test, the apparatus being configured to insert a device under test into the test burn-in board and to pull the device under test out of the test burn-in board, the apparatus comprising:

a test circuit for testing the device under test before a burn-in test;

a test member for testing the test burn-in board; and an electronic switch being electrically connected with the burn-in board on which the devices under test are mounted, and the electronic switch switching between first test signals of the test circuit and second test signals of the test member.

6. The apparatus as claimed in claim 5, wherein when the test of the devices under test are performed by the test circuit, the devices under test are mounted on only normal sockets on the burn-in board, the normal sockets having been judged non-defective by the test member, and no devices under test are mounted on sockets which were judged defective by the test member.

7. A method for testing a test burn-in board and a device under test by an apparatus which is configured to insert the device under test into the test burn-in board and to pull the device under test out of the test burn-in board, the method comprising:

testing the test burn-in board by a test member;

testing the device under test by a test circuit before a burn-in test; and switching between first test signals of the test circuit and second test signals of the test member by an electronic switch which is electrically connected with the test burn-in board on which the devices under test are mounted;

wherein the tests of the test burn-in board and the device under test are performed in one apparatus before a burn-in test.

* * * * *